US009634178B1

(12) United States Patent
Kim et al.

(10) Patent No.: US 9,634,178 B1
(45) Date of Patent: Apr. 25, 2017

(54) METHOD OF USING LASER WELDING TO OHMIC CONTACT OF METALLIC THERMAL AND DIFFUSION BARRIER LAYER FOR FOIL-BASED METALLIZATION OF SOLAR CELLS

(71) Applicants: Taeseok Kim, San Jose, CA (US); Robert Woehl, San Jose, CA (US); Gabriel Harley, Mountain View, CA (US); Nils-Peter Harder, San Jose, CA (US); Jens-Dirk Moschner, Herverlee (DE); Matthieu Moors, Braine-le-Château (BE); Michel Arsène Olivier Ngamo Toko, Brussels (BE)

(72) Inventors: Taeseok Kim, San Jose, CA (US); Robert Woehl, San Jose, CA (US); Gabriel Harley, Mountain View, CA (US); Nils-Peter Harder, San Jose, CA (US); Jens-Dirk Moschner, Herverlee (DE); Matthieu Moors, Braine-le-Château (BE); Michel Arsène Olivier Ngamo Toko, Brussels (BE)

(73) Assignees: SunPower Corporation, San Jose, CA (US); Total Marketing Services, Puteux (FR)

( * ) Notice: Subject to any disclaimer, the term of this patent is extended or adjusted under 35 U.S.C. 154(b) by 0 days.

(21) Appl. No.: 14/971,335

(22) Filed: Dec. 16, 2015

(51) Int. Cl.
*H01L 31/18* (2006.01)
*H01L 31/05* (2014.01)
(Continued)

(52) U.S. Cl.
CPC ...... *H01L 31/182* (2013.01); *H01L 31/03682* (2013.01); *H01L 31/05* (2013.01); *H01L 31/0547* (2014.12); *H01L 31/1804* (2013.01); *H01L 31/022441* (2013.01); *H01L 31/0516* (2013.01)

(58) Field of Classification Search
CPC ........... H01L 31/182; H01L 31/022441; H01L 31/0516; H01L 31/05; H01L 31/0547; H01L 31/03682; H01L 31/1804
See application file for complete search history.

(56) References Cited

U.S. PATENT DOCUMENTS 9,178,104 B2 * 11/2015 Moors .................... H01L 31/18
2008/0216887 A1 9/2008 Hacke et al.
(Continued)

*Primary Examiner* — Michael Jung
(74) *Attorney, Agent, or Firm* — Blakely Sokoloff Taylor Zafman LLP

(57) ABSTRACT

Methods of fabricating solar cells using a metal-containing thermal and diffusion barrier layer in foil-based metallization approaches, and the resulting solar cells, are described. For example, a method of fabricating a solar cell includes forming a plurality of semiconductor regions in or above a substrate. The method also includes forming a metal-containing thermal and diffusion barrier layer above the plurality of semiconductor regions. The method also includes forming a metal seed layer on the metal-containing thermal and diffusion barrier layer. The method also includes forming a metal conductor layer on the metal seed layer. The method also includes laser welding the metal conductor layer to the metal seed layer. The metal-containing thermal and diffusion barrier layer protects the plurality of semiconductor regions during the laser welding.

18 Claims, 9 Drawing Sheets

222 224 224 222 220 218 216 202 204

250 220' 224 224 220' 218' 216' 214' 206 202 208 206 204 208 202 200

(51) Int. Cl.

*H01L 31/054* (2014.01)
*H01L 31/0368* (2006.01)
*H01L 31/0224* (2006.01)

(56) References Cited

U.S. PATENT DOCUMENTS

2009/0283141 A1* 11/2009 Bentzen ............ H01L 31/02167
136/256
2012/0204938 A1 8/2012 Hacke et al.
2015/0090329 A1* 4/2015 Pass .................. H01L 31/02244
136/256

* cited by examiner

METHOD OF USING LASER WELDING TO OHMIC CONTACT OF METALLIC THERMAL AND DIFFUSION BARRIER LAYER FOR FOIL-BASED METALLIZATION OF SOLAR CELLS

TECHNICAL FIELD

Embodiments of the present disclosure are in the field of renewable energy and, in particular, include methods of fabricating solar cells using a metal-containing thermal and diffusion barrier layer in foil-based metallization approaches, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures.

DETAILED DESCRIPTION

Figure 1:
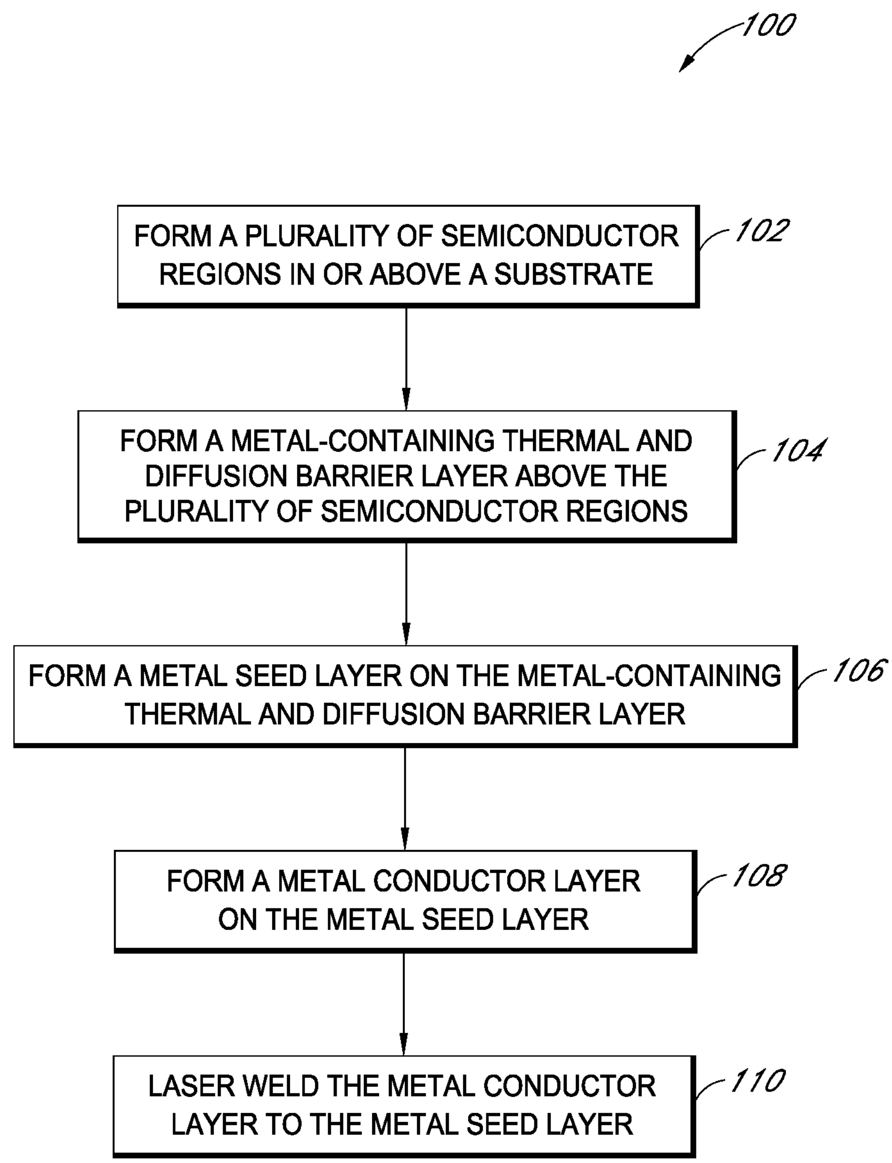
FIG. 1 is a flowchart listing operations in a method of fabricating a solar cell as corresponding to FIGS. 2A-2F, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Methods of fabricating solar cells using a metal-containing thermal and diffusion barrier layer in foil-based metallization approaches, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as emitter region fabrication techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating a solar cell includes forming a plurality of semiconductor regions in or above a substrate. The method also includes forming a metal-containing thermal and diffusion barrier layer above the plurality of semiconductor regions. The method also includes forming a metal seed layer on the metal-containing thermal and diffusion barrier layer. The method also includes forming a metal conductor layer on the metal seed layer. The method also includes laser welding the metal conductor layer to the metal seed layer. The metal-containing thermal and diffusion barrier layer protects the plurality of semiconductor regions during the laser welding.

In another embodiment, a method of fabricating a solar cell includes forming a plurality of alternating N-type and P-type polycrystalline silicon regions on a thin dielectric layer formed on a single crystalline silicon substrate. The method also includes forming a non-aluminum metal-containing layer above the alternating N-type and P-type polycrystalline silicon regions. The method also includes forming an aluminum seed layer on the non-aluminum metal-containing layer. The method also includes forming an aluminum foil on the aluminum seed layer. The method also includes laser welding the aluminum foil to the aluminum seed layer. The non-aluminum metal-containing layer protects the alternating N-type and P-type polycrystalline silicon regions during the laser welding.

Also disclosed herein are solar cells. In an embodiment, a solar cell includes a single crystalline silicon substrate. A plurality of alternating N-type and P-type polycrystalline silicon regions is disposed on a thin dielectric layer disposed on the single crystalline silicon substrate. A non-aluminum metal-containing layer is disposed above the alternating N-type and P-type polycrystalline silicon regions. An aluminum seed layer is disposed on the non-aluminum metal-containing layer. Aluminum foil portions are disposed on and spot-welded to the aluminum seed layer.

One or more embodiments described herein provides a thermal and diffusion barrier layer for metallization of solar cells. In an embodiment, in the context of metallization of solar cells by patterning a metallic foil bonded on the cell with a laser process, such a thermal and diffusion barrier layer protects silicon-containing portions of the cell from the heat of the laser and from consequential changes such as the diffusion of the metals of the foil into the silicon. In addition, the inclusion of such a thermal and diffusion barrier layer can improve the robustness of the cell due to the mechanical properties of the layer. Further advantages may include reduction of the cost of manufacturing a solar cell due to simplification of the metallization process.

To provide context, state-of-the-art metallization processing using laser welding of a metallic foil to an underlying cell can induces severe damage on the final device. For example, severe lifetime damage may occur when the laser welding lands on top of a direct heating of the laser contact area, where silicon and first level metal have a direct contact. Positioning of the laser welding dots (or lines) and the laser contact dots in an alternating manner can be implemented to avoid such damage. However, such positioning can demand further complexity of a laser scanning system, where any misalignment between the wafer and laser system could lead to device failure.

Addressing one or more of the above issues, in accordance with an embodiment of the present disclosure, a material inert and/or more resistant to the heat of the laser and to the diffusion of metals enhanced by the heat of the laser is included in a material stack of a solar cell. The material may be deposited by physical or chemical vapor deposition, for example, by reactive sputtering or RF/DC sputtering. A forming gas anneal may be implemented to stabilize and make more robust the layer as deposited. In one or more embodiments described herein, the layer is referred to as a metal-containing thermal and diffusion barrier layer.

In an exemplary process flow, FIGS. 2A-2F illustrate cross-sectional views of various stages in the fabrication of a solar cell, in accordance with an embodiment of the present disclosure. FIG. 1 is a flowchart 100 listing operations in a method of fabricating a solar cell as corresponding to FIGS. 2A-2F, in accordance with an embodiment of the present disclosure.

Figure 2A:
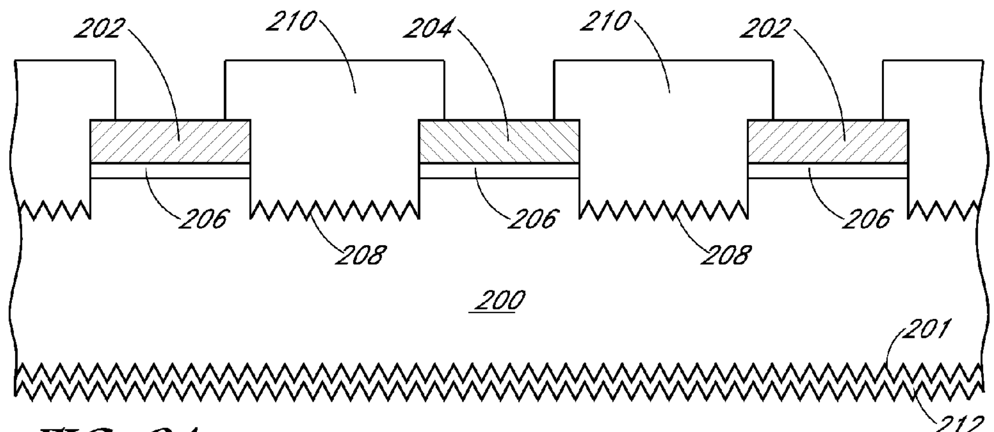
FIGS. 2A-2F illustrate cross-sectional views of various stages in the fabrication of a solar cell, in accordance with an embodiment of the present disclosure.

Referring to operation 102 of flowchart 100 and to corresponding FIG. 2A, a method of fabricating a solar cell includes forming a plurality of semiconductor regions 202/204 above a substrate 200. A thin dielectric material 206 may be included as an intervening material between the semiconductor regions 202/204 and the substrate 200. The substrate 200 has a light-receiving surface 201 opposite a back surface above which the plurality of semiconductor regions 202/204 is formed. In an embodiment, as depicted in FIG. 2A, each of the plurality of semiconductor regions 202/204 is spaced apart from one another. In a specific embodiment, the plurality of semiconductor regions 202/204 is a plurality of alternating N-type 202 and P-type 204 semiconductor regions.

In an embodiment, the substrate 200 is a monocrystalline silicon substrate, such as a bulk single crystalline N-type doped silicon substrate. It is to be appreciated, however, that substrate 200 may be a layer, such as a multi-crystalline silicon layer, disposed on a global solar cell substrate. In an embodiment, the thin dielectric layer 206 is a tunneling silicon oxide layer having a thickness of approximately 2 nanometers or less. In one such embodiment, the term "tunneling dielectric layer" refers to a very thin dielectric layer, through which electrical conduction can be achieved. The conduction may be due to quantum tunneling and/or the presence of small regions of direct physical connection through thin spots in the dielectric layer. In one embodiment, the tunneling dielectric layer is or includes a thin silicon oxide layer.

In an embodiment, in the case that the plurality of semiconductor regions 202/204 is a plurality of alternating N-type 202 and P-type 204 semiconductor regions, the alternating N-type and P-type semiconductor regions 202 and 204, respectively, are polycrystalline silicon regions formed by, e.g., using a plasma-enhanced chemical vapor deposition (PECVD) process. In one such embodiment, the N-type polycrystalline silicon regions 202 are doped with an N-type impurity, such as phosphorus. The P-type polycrystalline silicon regions 204 are doped with a P-type impurity, such as boron. As is depicted in FIG. 2A, the alternating N-type and P-type semiconductor regions 202 and 204 may have trenches 208 formed there between, the trenches 208 extending partially into the substrate 200. In an embodiment, an insulating layer 210 is disposed in the trenches 208 and between and partially on the alternating N-type and P-type semiconductor regions 202 and 204, as is depicted in FIG. 2A.

In an embodiment, the light receiving surface 201 is a texturized light-receiving surface, as is depicted in FIG. 2A. In one embodiment, a hydroxide-based wet etchant is employed to texturize the light receiving surface 201 of the substrate 200 and, possibly, the trench 208 surfaces as is also depicted in FIG. 2A. It is to be appreciated that the timing of the texturizing of the light receiving surface may vary. For example, the texturizing may be performed before or after the formation of the thin dielectric layer 206. In an embodiment, a texturized surface may be one which has a regular or an irregular shaped surface for scattering incoming light, decreasing the amount of light reflected off of the light receiving surface 201 of the solar cell. Referring again to FIG. 2A, additional embodiments can include formation of a passivation and/or anti-reflective coating (ARC) layers (shown collectively as layer 212) on the light-receiving surface 201. It is to be appreciated that the timing of the formation of passivation and/or ARC layers may also vary.

In an embodiment, the plurality of semiconductor regions 202/204 is formed from a polycrystalline silicon layer formed above the substrate 200, which may be single crystalline silicon substrate, as described above. In another embodiment, however, the substrate 200 is a single crystalline silicon substrate having the plurality of semiconductor regions 202/204 formed therein, as opposed to being formed in a semiconductor layer distinct from the substrate 200.

Figure 2B:
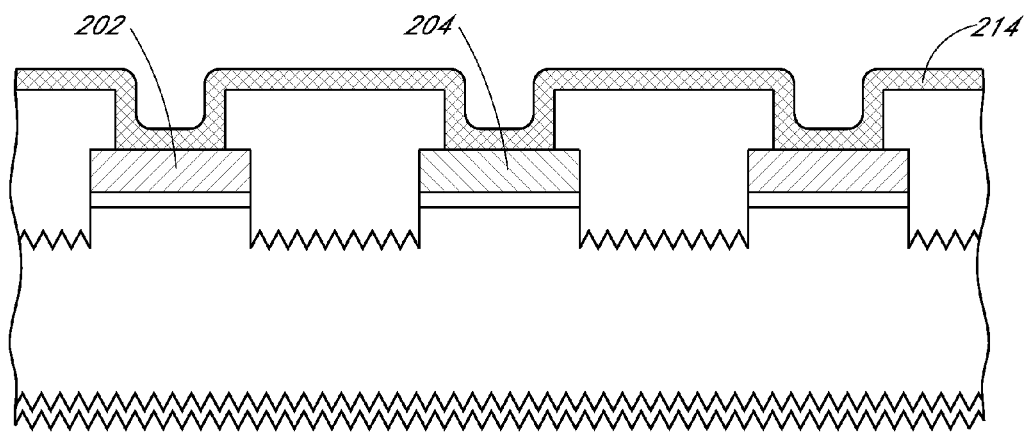
Figure 2C:
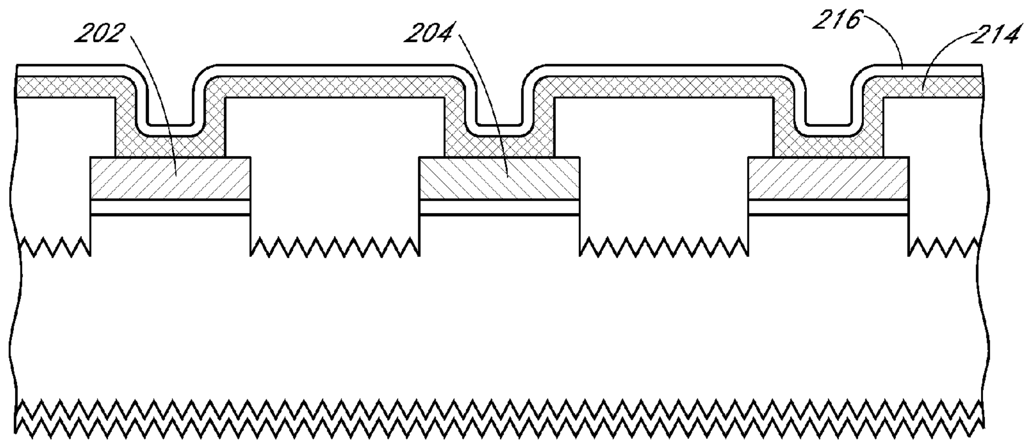

Referring to operation 104 of flowchart 100 and to corresponding FIG. 2C, the method of fabricating a solar cell also includes forming a metal-containing thermal and diffusion barrier layer 216 above the plurality of semiconductor regions 202/204.

In an embodiment, the metal-containing thermal and diffusion barrier layer 216 is a layer of material such as, but not limited to, a layer of titanium nitride (TiN), a layer of titanium tungsten (TiW), or a layer of tantalum nitride (TaN). In an embodiment, the metal-containing thermal and diffusion barrier layer 216 is a layer of material formed by chemical vapor deposition or physical vapor deposition to a thickness approximately in the range of 30-500 nanometers.

Referring now to FIGS. 2B and 2C, in an embodiment, prior to forming the metal-containing thermal and diffusion barrier layer 216, a reflectance layer 214 is formed on the plurality of semiconductor regions 202/204. The metal-containing thermal and diffusion barrier layer 216 is formed on the reflectance layer 214.

In an embodiment, the reflectance layer 214 is defined as a layer exhibiting little to no absorption of light, and having a refractive index lower than that of the semiconductor regions 202/204. In an embodiment, the reflectance layer 214 includes a layer of aluminum having a thickness approximately in the range of 20-100 nanometers. In a particular embodiment, the plurality of semiconductor regions 202/204 is a plurality of silicon regions formed above the substrate 200, and the reflectance layer 214 includes a layer of aluminum having an amount of aluminum less than required to form a eutectic mixture with the plurality of silicon regions 202/204.

Figure 2D:
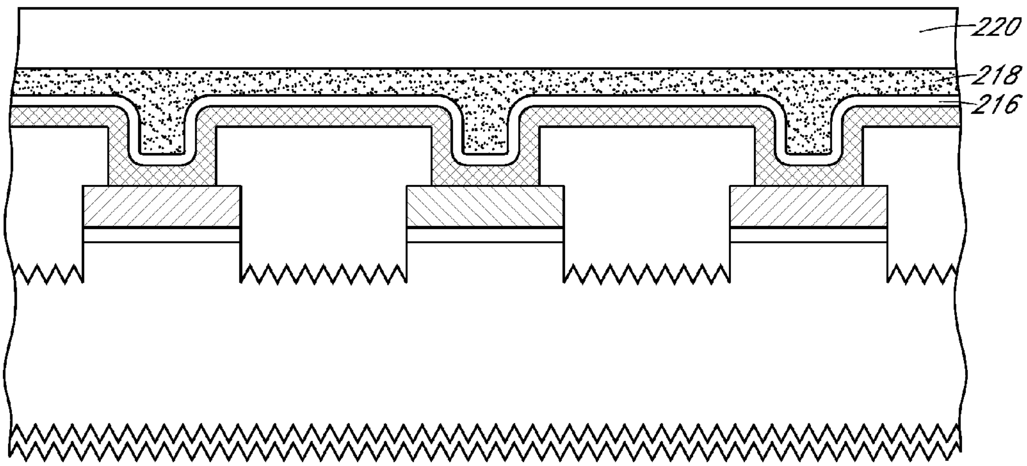

Referring to operation 106 of flowchart 100 and to corresponding FIG. 2D, the method of fabricating a solar cell also includes forming a metal seed layer 218 on the metal-containing thermal and diffusion barrier layer 216. In an embodiment, the metal seed layer 218 includes a layer having a thickness approximately in the range of 0.05 to 20 microns and includes aluminum in an amount greater than approximately 90 atomic %. In an embodiment, the metal seed layer 218 is deposited as a blanket layer which is later patterned. In another embodiment, the metal seed layer 218 is deposited as patterned layer. In one such embodiment, the patterned metal seed layer is deposited by printing the patterned metal seed layer.

Referring to operation 108 of flowchart 100 and again to corresponding FIG. 2D, the method of fabricating a solar cell also includes forming a metal conductor layer 220 on the metal seed layer 218. In an embodiment, the metal seed layer 218 includes a layer having a thickness approximately in the range of 0.05 to 20 microns. In one such embodiment, the metal seed layer 218 includes aluminum in an amount greater than approximately 90 atomic %. In a specific such embodiment, the metal conductor layer 220 includes aluminum. In an embodiment, the metal seed layer 218 includes aluminum in an amount greater than approximately 90 atomic %.

In an embodiment, the metal conductor layer 220 is a metal foil formed on the metal seed layer 218, as is depicted in FIG. 2D. In one such embodiment, the metal foil is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil.

In another embodiment, the metal conductor layer 220 is a metal wire formed on the metal seed layer 218. In one such embodiment, the wire is an aluminum (Al) or copper (Cu) wire.

Figure 2E:
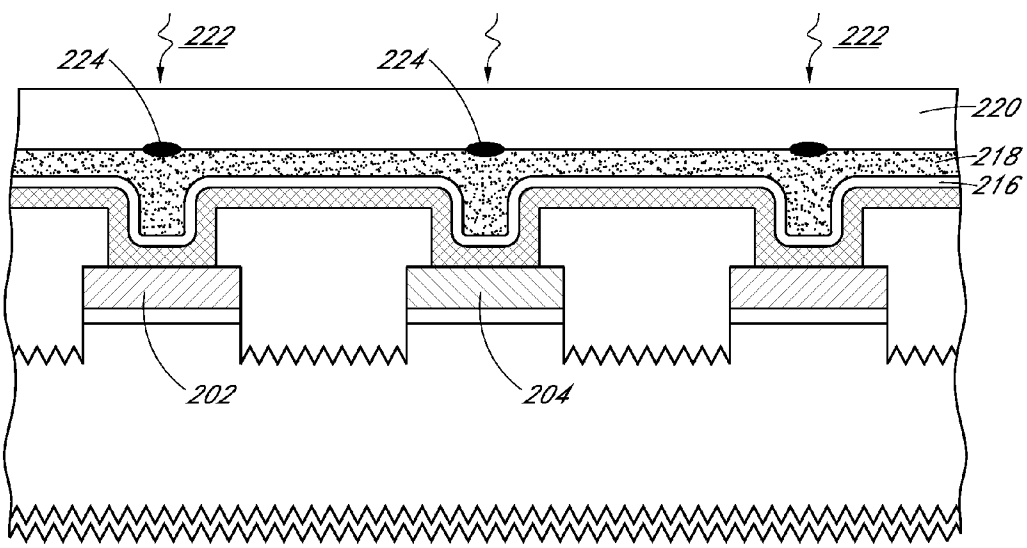

Referring to operation 110 of flowchart 100 and to corresponding FIG. 2E, the method of fabricating a solar cell also includes laser welding 222 the metal conductor layer 220 to the metal seed layer 218. In one such embodiment, welded regions 224 are formed, as is depicted in FIG. 2E. In an embodiment, the metal-containing thermal and diffusion barrier layer 216 protects the plurality of semiconductor regions 202/204 during the laser welding 222.

Figure 2F:
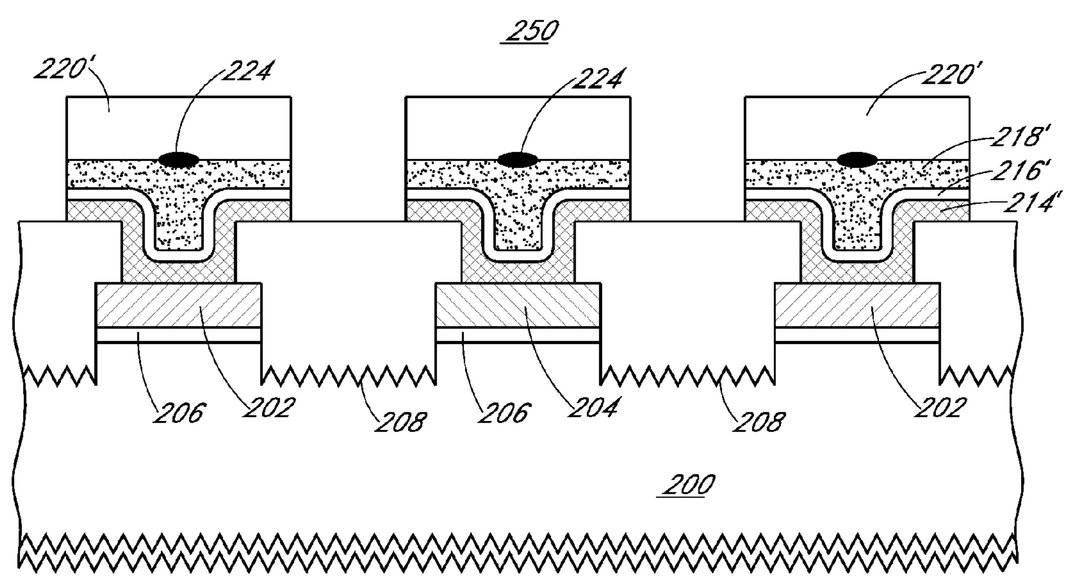

Referring to FIG. 2F, in an embodiment, the method of fabricating a solar cell further includes, subsequent to laser welding 222 the metal foil 220 to the metal seed layer 218, patterning the metal foil 222, e.g., to form patterned metal foil regions 220', as is depicted in FIG. 2F. However, in another embodiment, the metal foil 220 is patterned prior to laser welding 222 the metal foil 220 to the metal seed layer 218.

In an embodiment, patterning the metal foil 220 involves laser ablating through only a portion of the metal foil 220 at regions in alignment with locations between the plurality of semiconductor regions 202/204 and, subsequent to the laser ablating, etching the remaining metal foil to isolate regions of remaining metal foil in alignment with the plurality of semiconductor regions 202/204, as is described in greater detail below in association with FIGS. 5A-5C. In another embodiment, patterning the metal foil 220 involves laser ablating through only a portion of the metal foil 220 at regions in alignment with locations between the plurality of semiconductor regions 202/204 and, subsequent to the laser ablating, anodizing the metal foil to isolate regions of remaining metal foil in alignment with the plurality of semiconductor regions 202/204, as is also described in greater detail below in association with FIGS. 5A-5C.

In an embodiment, the metal seed layer 218 and the metal-containing thermal and diffusion barrier layer 216 are not patterned prior to forming the metal conductor layer 220 on the metal seed layer 218. The metal seed layer 218 and the metal-containing thermal and diffusion barrier layer 216 are patterned at substantially the same time as patterning the metal foil 220, forming patterned metal seed layer 218' and patterned metal-containing thermal and diffusion barrier layer 216' (and, if present, patterned reflectance layer 214'), as is depicted in FIG. 2F. However, in another embodiment, the metal seed layer 218 and the metal-containing thermal and diffusion barrier layer 216 are patterned prior to forming the metal conductor layer 220 on the metal seed layer 218, an example of which is described in greater detail below in association with FIGS. 5A-5C.

A solar cell may be fabricated according to the above described method. With reference again to FIG. 2F, in an exemplary embodiment, a solar cell 250 includes a single crystalline silicon substrate 200. A plurality of alternating N-type 202 and P-type 204 polycrystalline silicon regions is disposed on a thin dielectric layer 206 disposed on the single crystalline silicon substrate 200. A non-aluminum metal-containing layer 216' is disposed above the alternating N-type 202 and P-type 204 polycrystalline silicon regions. An aluminum seed layer 218' is disposed on the non-aluminum metal-containing layer 216'. Aluminum foil portions 220' are disposed on and spot-welded 224 to the aluminum seed layer 218', providing electrical contact structures for the alternating N-type 202 and P-type 204 polycrystalline silicon regions.

Referring again to FIG. 2F, in an embodiment, the solar cell 250 further includes a thin aluminum layer 214' disposed on the alternating N-type 202 and P-type 204 polycrystalline silicon regions. The non-aluminum metal-containing layer 216' is disposed on the thin aluminum layer 214'. In one such embodiment, the thin aluminum layer 214' has an amount of aluminum less than required to form a eutectic mixture with the plurality of alternating N-type 202 and P-type 206 polycrystalline silicon regions. In one embodiment, the thin aluminum layer 214' is a layer of aluminum having a thickness approximately in the range of 20-100 nanometers.

In an embodiment, the non-aluminum metal-containing layer 216' is a layer such as, but not limited to, a layer of titanium nitride (TiN), a layer of titanium tungsten (TiW), or a layer of tantalum nitride (TaN). In an embodiment, the aluminum seed layer 216' has a thickness approximately in the range of 0.05 to 20 microns and includes aluminum in an amount greater than approximately 90 atomic %. In an embodiment, a trench 208 is disposed between each of the alternating N-type 202 and P-type 204 polycrystalline silicon regions and extends partially into the single crystalline silicon substrate 200, as is depicted in FIG. 2F.

Figure 3:
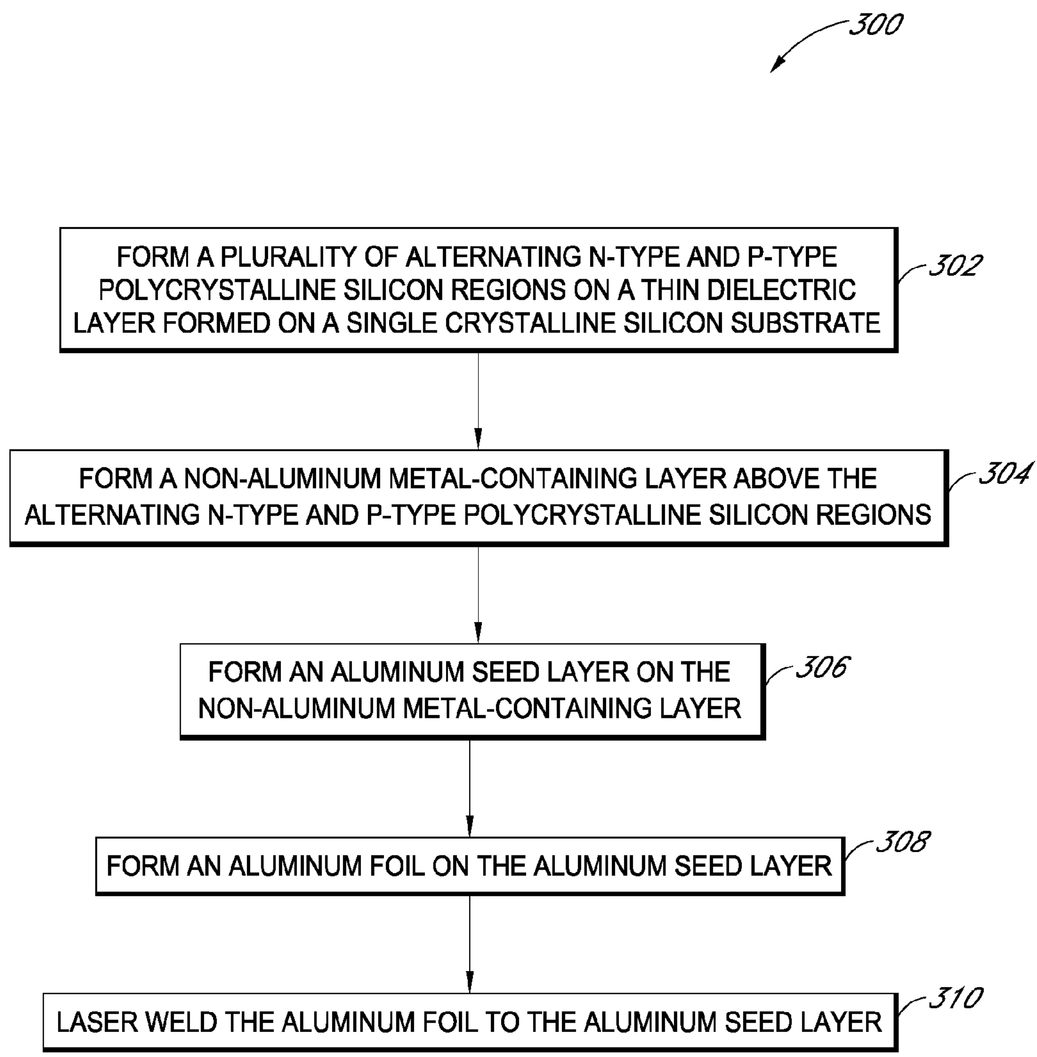
FIG. 3 is a flowchart listing operations in another method of fabricating a solar cell, in accordance with an embodiment of the present disclosure.

It is to be appreciated that the method of flowchart 100 is described generically with respect to the type of semiconductor regions formed for a solar cell. In a more specific exemplary processing scheme, FIG. 3 is a flowchart 300 listing operations in another method of fabricating a solar cell, in accordance with an embodiment of the present disclosure.

Referring to operation 302 of flowchart 300, a method of fabricating a solar cell includes forming a plurality of alternating N-type and P-type polycrystalline silicon regions on a thin dielectric layer formed on a single crystalline silicon substrate.

Referring to operation 304 of flowchart 300, the method of fabricating a solar cell also includes forming a non-aluminum metal-containing layer above the alternating N-type and P-type polycrystalline silicon regions.

In an embodiment, prior to forming the non-aluminum metal-containing layer, the method further includes forming a thin aluminum layer on the alternating N-type and P-type polycrystalline silicon regions. The non-aluminum metal-containing layer is formed on the thin aluminum layer. In one such embodiment, the thin aluminum layer is a layer of aluminum having an amount of aluminum less than required to form a eutectic mixture with the plurality of alternating N-type and P-type polycrystalline silicon regions. In one embodiment, the thin aluminum layer is a layer of aluminum having a thickness approximately in the range of 20-100 nanometers. In an embodiment, the non-aluminum metal-containing layer is a layer such as, but not limited to, a layer of titanium nitride (TiN), a layer of titanium tungsten (TiW), or a layer of tantalum nitride (TaN).

Referring to operation 306 of flowchart 300, the method of fabricating a solar cell also includes forming an aluminum seed layer on the non-aluminum metal-containing layer. In an embodiment, the aluminum seed layer is a layer having a thickness approximately in the range of 0.05 to 20 microns and including aluminum in an amount greater than approximately 90 atomic %.

Referring to operation 308 of flowchart 300, the method of fabricating a solar cell also includes forming an aluminum foil on the aluminum seed layer.

Referring to operation 310 of flowchart 300, the method of fabricating a solar cell also includes laser welding the aluminum foil to the aluminum seed layer. The non-aluminum metal-containing layer protects the alternating N-type and P-type polycrystalline silicon regions during the laser welding. In an embodiment, the aluminum foil is patterned prior to or subsequent to laser welding the aluminum foil to the aluminum seed layer.

As described above, in an embodiment, the ultimate metallization layer for fabricating electrical contact for a solar cell is a metal foil layer, such as an aluminum metal foil. In an exemplary processing scheme, FIGS. 4A-4C illustrate angled views of various stages in the fabrication of a solar cell using foil-based metallization, in accordance with an embodiment of the present disclosure.

Figure 4A:
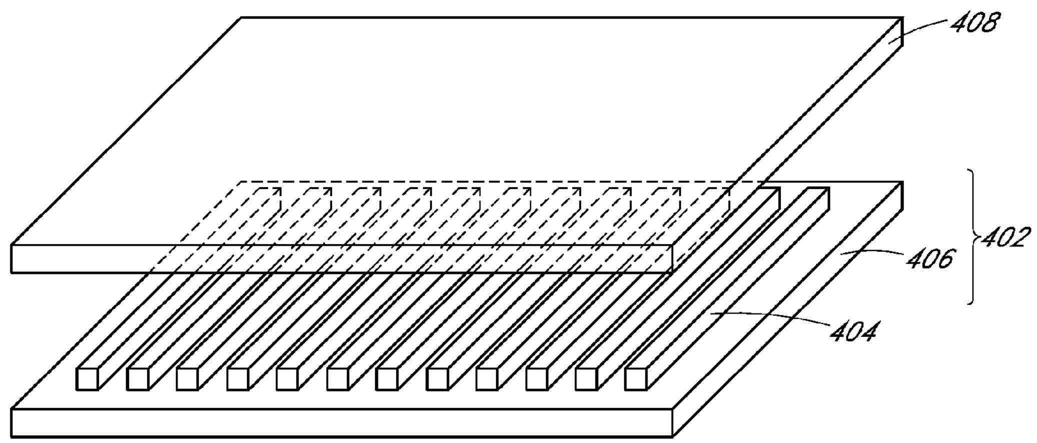
FIGS. 4A-4C illustrate angled views of various stages in the fabrication of a solar cell using foil-based metallization, in accordance with an embodiment of the present disclosure.
Figure 4B:
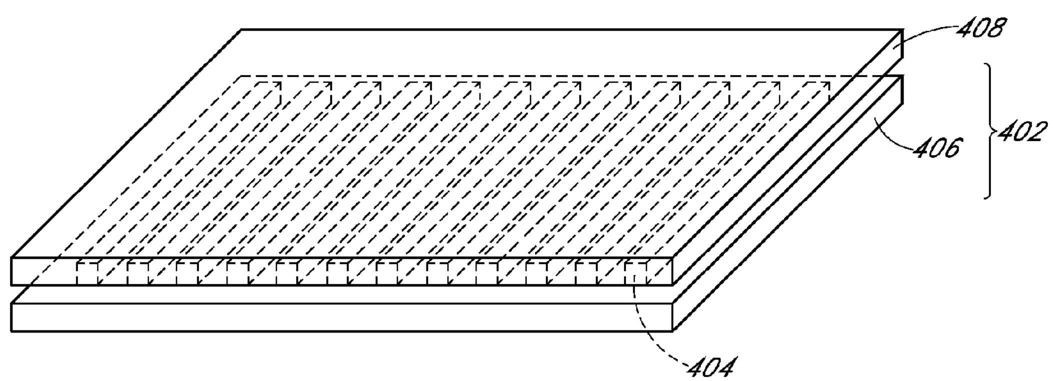

Referring to FIGS. 4A and 4B, a metal foil 408 is placed on a metallized surface of a wafer 402 having a plurality of regions 404 disposed on or above a substrate 406. In an embodiment, the plurality of regions 404 includes alternating N-type and P-type semiconductor regions, either a blanket seed layer or a plurality of metal seed material regions above each of the alternating N-type and P-type semiconductor regions, and either a blanket metal-containing thermal and diffusion barrier layer or a plurality of metal-containing thermal and diffusion barrier regions. In an embodiment, the metal foil 408 is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil. The metal foil 408 is located or fit-up with the metalized surface of the wafer 402, as shown in FIG. 4B.

Figure 4C:
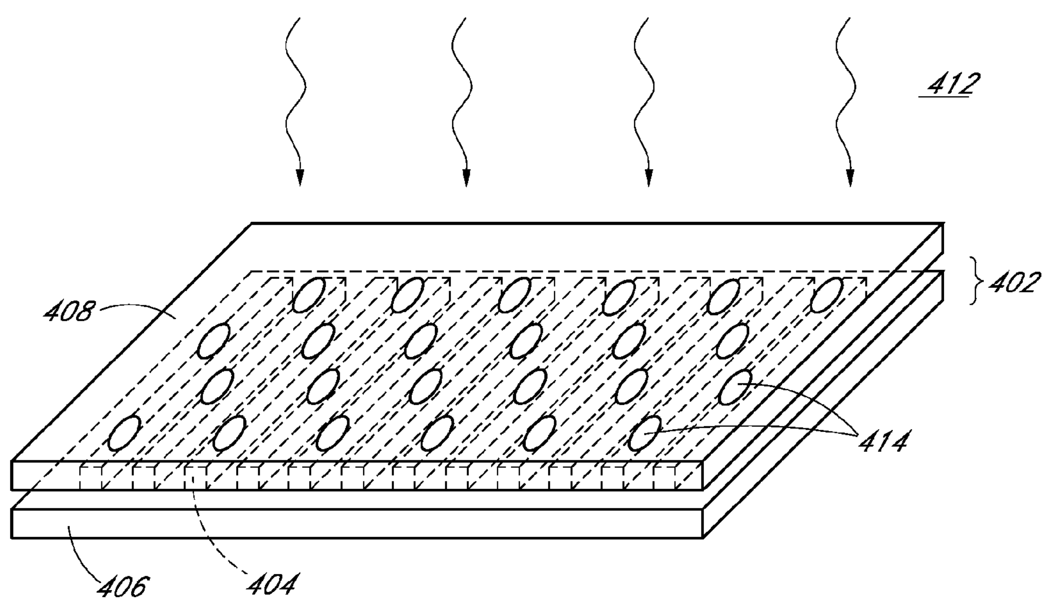

Referring to FIG. 4C, a plurality of spot welds 414 is formed between the metal foil 408 and the metalized surface of the wafer 402. In one embodiment, the spot welds 414 are formed by a laser process 412, as depicted in FIG. 4C. In an embodiment, the metal-containing thermal and diffusion barrier layer protects underlying semiconductor region during the laser process 412.

In an embodiment, at the time of joining the metal foil 408 and the substrate 402, the metal foil 408 has a surface area substantially larger than a surface area of the wafer 402 of the solar cell. In one such embodiment, subsequent to electrically contacting the metal foil 408 to the metalized surface of the wafer 402, the metal foil is cut to provide the metal foil 408 having a surface area substantially the same as the surface area of the wafer 402 of the solar cell. In another embodiment, however, prior to placing the metal foil 408 over the metalized surface of the wafer 402 of the solar cell, a large sheet of foil is cut to provide the metal foil 408 having a surface area substantially the same as a surface area of the wafer 402 of the solar cell, as is depicted in FIG. 4A.

A metal foil may ultimately be patterned to provide patterned electrical contacts for underlying semiconductor regions of a solar cell. The patterning of the metal foil may be performed above other material regions that have already been patterned. As an example, FIGS. 5A-5C illustrate cross-sectional views of various stages in the fabrication of a solar cell using foil-based metallization, in accordance with an embodiment of the present disclosure.

Figure 5A:
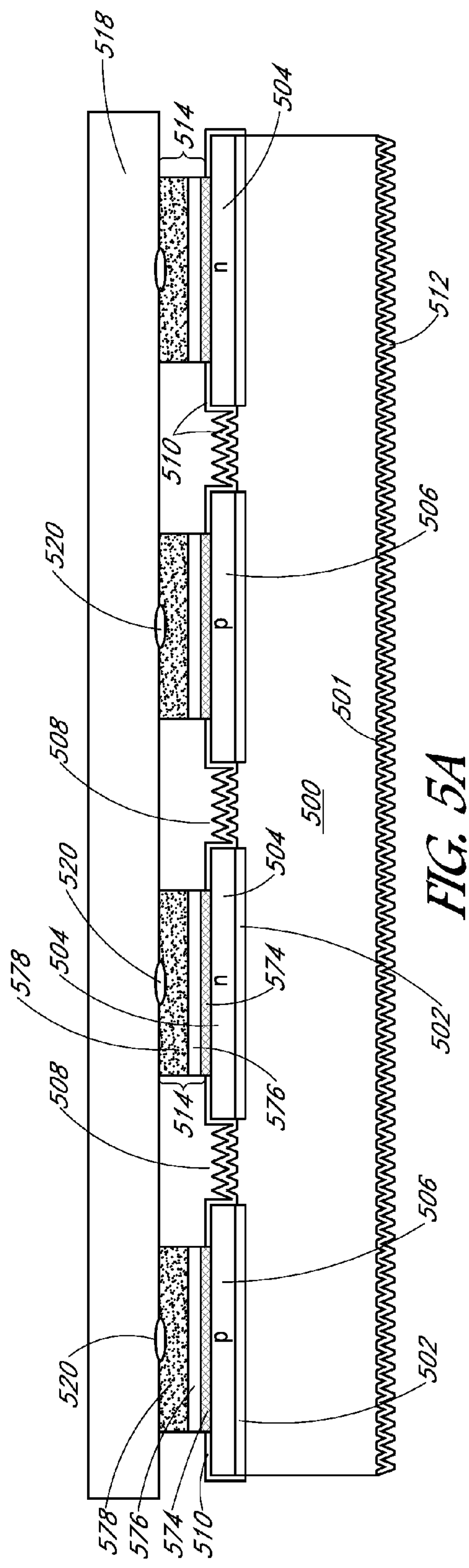
FIGS. 5A-5C illustrate cross-sectional views of various stages in the fabrication of a solar cell using foil-based metallization, in accordance with an embodiment of the present disclosure.

Referring to FIG. 5A, a substrate 500 has disposed there above N-type semiconductor regions 504 and P-type semiconductor regions 506 disposed on a thin dielectric material 502 as an intervening material between the N-type semiconductor regions 504 or P-type semiconductor regions 506, respectively, and the substrate 500. The substrate 500 has a light-receiving surface 501 opposite a back surface above which the N-type semiconductor regions 504 and P-type semiconductor regions 506 are formed.

In an embodiment, the substrate 500 is a monocrystalline silicon substrate, such as a bulk single crystalline N-type doped silicon substrate. It is to be appreciated, however, that substrate 500 may be a layer, such as a multi-crystalline silicon layer, disposed on a global solar cell substrate. In an embodiment, the thin dielectric layer 502 is a tunneling silicon oxide layer having a thickness of approximately 2 nanometers or less. In one such embodiment, the term “tunneling dielectric layer” refers to a very thin dielectric layer, through which electrical conduction can be achieved. The conduction may be due to quantum tunneling and/or the presence of small regions of direct physical connection through thin spots in the dielectric layer. In one embodiment, the tunneling dielectric layer is or includes a thin silicon oxide layer.

In an embodiment, the alternating N-type and P-type semiconductor regions 504 and 506, respectively, are formed from polycrystalline silicon formed by, e.g., using a plasma-enhanced chemical vapor deposition (PECVD) process. In one such embodiment, the N-type polycrystalline silicon emitter regions 504 are doped with an N-type impurity, such as phosphorus. The P-type polycrystalline silicon emitter regions 506 are doped with a P-type impurity, such as boron. As is depicted in FIG. 5A, the alternating N-type and P-type semiconductor regions 504 and 506 may have trenches 508 formed there between, the trenches 508 extending partially into the substrate 500. Additionally, in one embodiment, a bottom anti-reflective coating (BARC) material 510 or other protective layer (such as a layer amorphous silicon) is formed on the alternating N-type and P-type semiconductor regions 504 and 506, as is depicted in FIG. 5A.

In an embodiment, the light receiving surface 501 is a texturized light-receiving surface, as is depicted in FIG. 5A. In one embodiment, a hydroxide-based wet etchant is employed to texturize the light receiving surface 501 of the substrate 500 and, possibly, the trench 508 surfaces as is also depicted in FIG. 5A. It is to be appreciated that the timing of the texturizing of the light receiving surface may vary. For example, the texturizing may be performed before or after the formation of the thin dielectric layer 502. In an embodiment, a texturized surface may be one which has a regular or an irregular shaped surface for scattering incoming light, decreasing the amount of light reflected off of the light receiving surface 501 of the solar cell. Referring again to FIG. 5A, additional embodiments can include formation of a passivation and/or anti-reflective coating (ARC) layers (shown collectively as layer 512) on the light-receiving surface 501. It is to be appreciated that the timing of the formation of passivation and/or ARC layers may also vary.

Referring again to FIG. 5A, a plurality of material regions 514 is formed and patterned to provide intervening contact layers on each of the alternating N-type and P-type semiconductor regions 504 and 506. In an embodiment, each of the material regions includes a patterned reflectance layer 574, such as patterned reflectance layer 214' described above in association with FIG. 2F. A patterned metal-containing thermal and diffusion barrier layer 576, such as patterned metal-containing thermal and diffusion barrier layer 216' described above in association with FIG. 2F, is formed on the patterned reflectance layer 574. A patterned metal seed layer 578, such as patterned metal seed layer 218' described above in association with FIG. 2F, is formed on the patterned metal-containing thermal and diffusion barrier layer 576.

Referring again to FIG. 5A, a metal foil 518 is adhered to the alternating N-type and P-type semiconductor regions 504 and 506, i.e., via coupling with material regions 514. The metal foil 518 may be located or fit-up with the substrate 500 in a manner as described in association with FIGS. 4A-4C. In an embodiment, the metal foil 518 is adhered to the alternating N-type and P-type semiconductor regions 504 and 506 by directly coupling portions of the metal foil 518 with a corresponding portion of each of the metal seed material regions 578. In one such embodiment, the direct coupling of portions of the metal foil 518 with a corresponding material 514 involves forming a metal weld 520 at each of such locations, as is depicted in FIG. 5A.

In an embodiment, the metal foil 518 is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil. In an embodiment, the metal foil 518 is adhered directly to the metal seed material 578 by using a technique such as, but not limited to, a laser welding process, a thermal compression process and an ultrasonic bonding process.

Figure 5B:
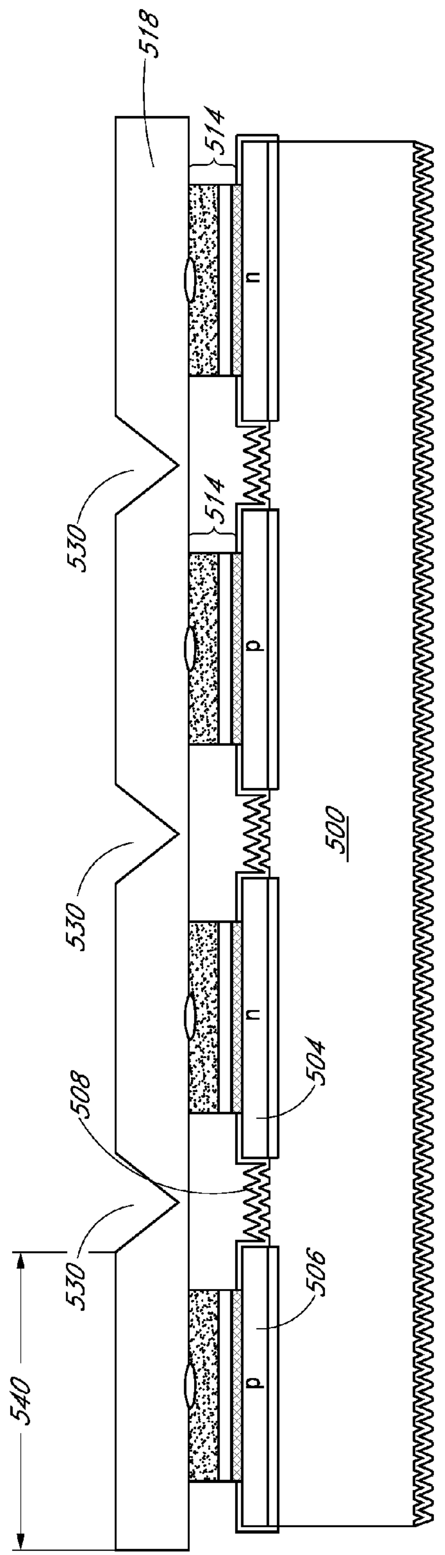

Referring to FIG. 5B, grooves or indentations 530 are formed in the metal foil 518 at regions corresponding to locations between the alternating N-type and P-type semiconductor regions 504 and 506, e.g., above trench 508 locations. In an embodiment, the grooves or indentations 530 are formed through only a portion of the metal foil 518, i.e., extending partially into, but not entirely through, the metal foil 518, as is depicted in FIG. 5B. In an embodiment, the grooves or indentations 530 are formed to a depth approximately in the range of 75-90% of an entire thickness of the metal foil 518. Conductive regions 540 are retained between each of the grooves or indentations 530. In an embodiment, features 530 are grooves formed by a laser scribing process. In another embodiment, the features 530 are indentations formed by a mechanical patterning process.

Figure 5C:
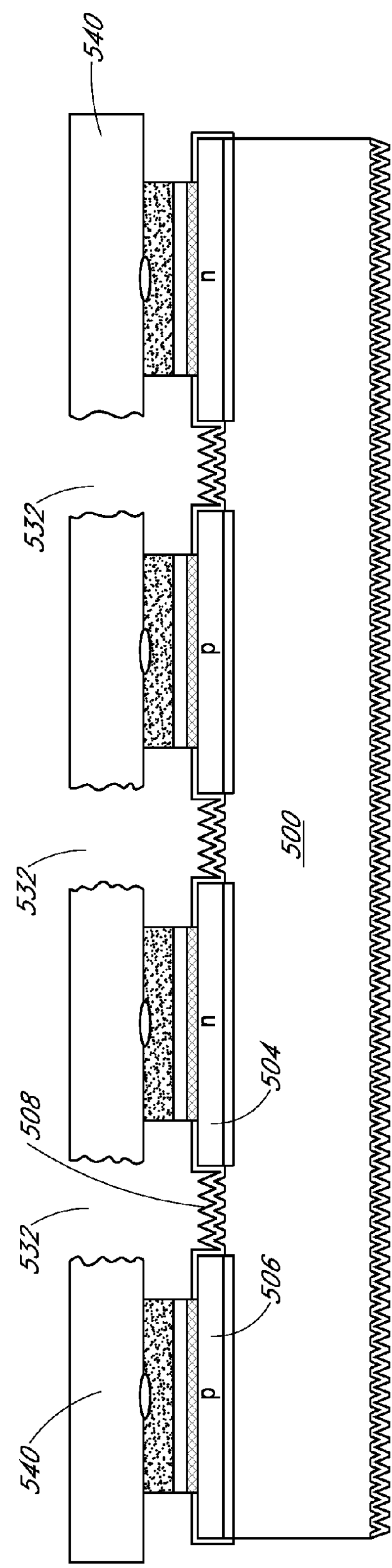

Referring to FIG. 5C, subsequent to forming the plurality of grooves or indentations 530, regions 540 of the remaining metal foil 518 corresponding to the alternating N-type 504 and P-type 506 semiconductor regions are isolated. That is, the grooves or indentations 530 of FIG. 5B are used to isolate conductive regions 540 as metallization structures for the underlying semiconductor regions of the solar cell. For example, referring to FIG. 5C, the grooves or indentations 530 are extended to provide gaps 532 between conductive regions 540. In an embodiment, the patterned metal foil 518 is etched to isolate portions 540 of the metal foil 518. In one such embodiment, the structure of FIG. 5B is exposed to a wet etchant. Although the wet etchant etches all exposed portions of the metal foil 518, a carefully timed etch process is used to break through the bottoms of the grooves or indentations 530 without significantly reducing the thickness of the non-indented regions 540 of the metal foil 518, as is depicted in FIG. 5C. In a particular embodiment, a hydroxide based etchant is used, such as, but not limited to, sodium hydroxide, potassium hydroxide (KOH) or tetramethylammonium hydroxide (TMAH).

In another embodiment (not shown), the remaining metal foil 518 of FIG. 5B is subsequently anodized at exposed surfaces thereof to isolate regions 540 of the remaining metal foil 518 corresponding to the alternating N-type and P-type semiconductor regions 504 and 506. In particular, the exposed surfaces of the metal foil 518, including the surfaces of the grooves or indentations 530, are anodized to form an oxide coating. At locations corresponding to the alternating N-type and P-type semiconductor regions 504 and 506, e.g., in the indentations 530 at locations above the trenches 508, the entire remaining thickness of the metal foil 518 is anodized there through to isolate regions 540 of metal foil 518 remaining above each of the N-type and P-type semiconductor regions 504 and 506.

Although certain materials are described specifically with reference to above described embodiments, some materials may be readily substituted with others with such embodiments remaining within the spirit and scope of embodiments of the present disclosure. For example, in an embodiment, a different material substrate, such as a group III-V material substrate, can be used instead of a silicon substrate. Furthermore, it is to be understood that, where the ordering of N+ and then P+ type doping is described specifically for emitter regions on a back surface of a solar cell, other embodiments contemplated include the opposite ordering of conductivity type, e.g., P+ and then N+ type doping, respectively. Additionally, although reference is made significantly to back contact solar cell arrangements, it is to be appreciated that approaches described herein may have application to front contact solar cells as well. In other embodiments, the above described approaches can be applicable to manufacturing of other than solar cells. For example, manufacturing of light emitting diode (LEDs) may benefit from approaches described herein.

Thus, methods of fabricating solar cells using a metal-containing thermal and diffusion barrier layer in foil-based metallization approaches, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:

forming a plurality of semiconductor regions in or above a substrate;

forming a metal-containing thermal and diffusion barrier layer above the plurality of semiconductor regions;

forming a metal seed layer on the metal-containing thermal and diffusion barrier layer;

forming a metal conductor layer on the metal seed layer; and laser welding the metal conductor layer to the metal seed layer, wherein the metal-containing thermal and diffusion barrier layer protects the plurality of semiconductor regions during the laser welding, wherein forming the metal-containing thermal and diffusion barrier layer comprises forming a layer of material selected from the group consisting of a layer of titanium nitride (TiN), a layer of titanium tungsten (TiW), and a layer of tantalum nitride (TaN).

2. A method of fabricating a solar cell, the method comprising:

forming a plurality of alternating N-type and P-type polycrystalline silicon regions on a thin dielectric layer formed on a single crystalline silicon substrate;

forming a non-aluminum metal-containing layer above the alternating N-type and P-type polycrystalline silicon regions;

forming an aluminum seed layer on the non-aluminum metal-containing layer;

forming an aluminum foil on the aluminum seed layer; and laser welding the aluminum foil to the aluminum seed layer, wherein the non-aluminum metal-containing layer protects the alternating N-type and P-type polycrystalline silicon regions during the laser welding, prior to forming the non-aluminum metal-containing layer, forming a thin aluminum layer on the alternating N-type and P-type polycrystalline silicon regions, wherein the non-aluminum metal-containing layer is formed on the thin aluminum layer.

3. The method of claim 2, wherein forming the reflectance layer comprises forming a layer of aluminum having a thickness approximately in the range of 20-100 nanometers.

4. The method of claim 2, wherein forming the plurality of semiconductor regions comprises forming a plurality of silicon regions above the substrate, and wherein forming the reflectance layer comprises forming a layer of aluminum having an amount of aluminum less than required to form a eutectic mixture with the plurality of silicon regions.

5. The method of claim 1, wherein forming the metal conductor layer on the metal seed layer comprises forming a metal foil on the metal seed layer.

6. The method of claim 5, further comprising:

subsequent to laser welding the metal foil to the metal seed layer, patterning the metal foil.

7. The method of claim 5, further comprising:

prior to laser welding the metal foil to the metal seed layer, patterning the metal foil.

8. The method of claim 5, wherein patterning the metal foil comprises:

laser ablating through only a portion of the metal foil at regions in alignment with locations between the plurality of semiconductor regions; and subsequent to the laser ablating, etching the remaining metal foil to isolate regions of remaining metal foil in alignment with the plurality of semiconductor regions.

9. The method of claim 5, wherein patterning the metal foil comprises:

laser ablating through only a portion of the metal foil at regions in alignment with locations between the plurality of semiconductor regions; and subsequent to the laser ablating, anodizing the metal foil to isolate regions of remaining metal foil in alignment with the plurality of semiconductor regions.

10. The method of claim 5, wherein the metal seed layer and the metal-containing thermal and diffusion barrier layer are not patterned prior to forming the metal conductor layer on the metal seed layer, the method further comprising:

patterning the metal seed layer and the metal-containing thermal and diffusion barrier layer at substantially the same time as patterning the metal foil.

11. The method of claim 1, wherein the metal seed layer and the metal-containing thermal and diffusion barrier layer are patterned prior to forming the metal conductor layer on the metal seed layer.

12. The method of claim 1, wherein forming the metal conductor layer on the metal seed layer comprises forming a metal wire on the metal seed layer.

13. The method of claim 1, wherein forming the plurality of semiconductor regions comprises forming the plurality of semiconductor regions from a polycrystalline silicon layer formed above the substrate, the method further comprising:

forming a trench between each of the plurality of semiconductor regions and extending partially into the substrate.

14. The method of claim 1, wherein the substrate is a single crystalline silicon substrate, and wherein forming the plurality of semiconductor regions comprises forming the plurality of semiconductor regions in the single crystalline silicon substrate.

15. The method of claim 1, wherein forming the forming the metal seed layer comprises forming a layer having a thickness approximately in the range of 0.05 to 20 microns and comprising aluminum in an amount greater than approximately 90 atomic %, and wherein the metal conductor layer comprises aluminum.

16. The method of claim 1, wherein forming the metal-containing thermal and diffusion barrier layer comprises forming a layer of material by chemical vapor deposition or physical vapor deposition, and to a thickness approximately in the range of 30-500 nanometers.

17. The method of claim 1, wherein forming the plurality of semiconductor regions comprises forming a plurality of alternating N-type and P-type semiconductor regions.

18. A method of fabricating a solar cell, the method comprising:

forming a plurality of alternating N-type and P-type polycrystalline silicon regions on a thin dielectric layer formed on a single crystalline silicon substrate;

forming a non-aluminum metal-containing layer above the alternating N-type and P-type polycrystalline silicon regions;

forming an aluminum seed layer on the non-aluminum metal-containing layer;

forming an aluminum foil on the aluminum seed layer; and laser welding the aluminum foil to the aluminum seed layer, wherein the non-aluminum metal-containing layer protects the alternating N-type and P-type polycrystalline silicon regions during the laser welding.

* * * * *